(12) United States Patent
Moriguchi et al.

(10) Patent No.: US 9,312,578 B2
(45) Date of Patent: Apr. 12, 2016

(54) BATTERY MODULE AND INSULATION INSPECTING METHOD OF BATTERY MODULE

(71) Applicant: Lithium Energy Japan, Kyoto-shi (JP)

(72) Inventors: Suguru Moriguchi, Ritto (JP); Hirohisa Toritani, Ritto (JP); Yoshihiro Masuda, Ritto (JP); Hironori Aida, Ritto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 105 days.

(21) Appl. No.: 14/039,275

(22) Filed: Sep. 27, 2013

(65) Prior Publication Data

US 2014/0091805 A1    Apr. 3, 2014

(30) Foreign Application Priority Data

Sep. 28, 2012  (JP) ................. 2012-217468

(51) Int. Cl.
| | |
|---|---|
| H02J 7/00 | (2006.01) |
| H01M 10/48 | (2006.01) |
| G01R 31/12 | (2006.01) |
| H01M 2/10 | (2006.01) |
| G01R 31/36 | (2006.01) |
| G01R 31/20 | (2006.01) |

(52) U.S. Cl.
CPC ........... *H01M 10/48* (2013.01); *G01R 31/1263* (2013.01); *G01R 31/3627* (2013.01); *H01M 2/1016* (2013.01); *H01M 2/1077* (2013.01); *H01M 10/482* (2013.01); *G01R 31/20* (2013.01); *G01R 31/3644* (2013.01)

(58) Field of Classification Search
USPC ........................................... 320/107
See application file for complete search history.

(56) References Cited

U.S. PATENT DOCUMENTS

| | | | |
|---|---|---|---|
| 6,100,702 | A | 8/2000 | Hagen et al. |
| 2012/0148908 | A1 | 6/2012 | Ito |

FOREIGN PATENT DOCUMENTS

| | | | |
|---|---|---|---|
| JP | H8-185896 A | | 7/1996 |
| JP | 200336881 A | * | 2/2003 |
| JP | 2003-346749 A | | 12/2003 |
| JP | 2006-318703 A | | 11/2006 |
| WO | WO 2008/033064 A1 | | 3/2008 |

OTHER PUBLICATIONS

WO 95/24727, Stephane et al., Sep. 14, 1995.*
Extended European Search Report dated Jan. 7, 2014.

* cited by examiner

*Primary Examiner* — Samuel Berhanu
(74) *Attorney, Agent, or Firm* — McGinn IP Law Group, PLLC.

(57) ABSTRACT

A battery module includes a metal casing and a battery cell accommodated in the casing. The casing is provided on its outer surface with an insulation layer and a conductive portion.

16 Claims, 4 Drawing Sheets

BATTERY MODULE AND INSULATION INSPECTING METHOD OF BATTERY MODULE

CROSS-REFERENCE TO RELATED APPLICATIONS

This application claims priority of Japanese Patent Application No.: 2012-217468 filed on Sep. 28, 2012, the content of which is incorporated herein by reference.

FIELD

The present invention relates to a battery module and an insulation inspecting method thereof.

BACKGROUND

Some of conventional battery modules include plurality of battery cells arranged in parallel and accommodated in a casing (e.g., see JP 2003-346749 A).

The casing of the conventional battery module is made of synthetic resin material. Therefore, since the casing does not have sufficient strength, when mounted in a vehicle, the battery module is possibly damaged due to vibration. An attempt to enhance the strength can causes another problem where a volume occupied by the casing is increased, which results in that downsizing requirement cannot be satisfied.

Therefore, metal material is used for the casing in order to enhance its strength. Usually, a surface of such a metal casing is subject to coating for rust prevention.

In the case of the battery module adopting the metal casing, if battery cells and the casing come into contact with each other due to such reason as battery cells are obliquely disposed in the casing at the time of manufacturing and the battery cells and the casing come into contact with each other, then slight current flow can be caused. This slight current flow can reduce battery voltage. Therefore, it is necessary to inspect whether insulation of the casing is maintained.

However, since the surface of the metal casing is subject to coating, it is difficult to inspect the insulation.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

It is an object of the present invention to provide a battery module and an insulation inspecting method thereof capable of easily inspecting insulation with a simple configuration without increasing the number of operation steps.

An aspect of the present invention provides a battery module, comprising, a casing made of metal and provided on its outer surface with an insulation layer and a conductive portion, and a battery cell accommodated in the casing.

BRIEF DESCRIPTION OF DRAWINGS

The foregoing and the other features of the present invention will become apparent from the following description and drawings of an illustrative embodiment of the invention in which.

DESCRIPTION OF EMBODIMENTS

An aspect of the present invention provides a battery module, comprising, a casing made of metal and provided on its outer surface with an insulation layer and a conductive portion, and a battery cell accommodated in the casing.

Although only requiring to previously form the conductive portion on the casing which can be done easily, this configuration can achieve easy insulation inspection through the conductive portion.

Preferably, the conductive portion is a metal member fixed to the casing.

Preferably, the conductive portion is a rivet which is fixed to the casing so as to penetrate the casing and the insulation layer.

It is preferable that a recess recessed outward is formed in an inner surface of the casing, and that one end of the rivet is accommodated in the recess.

Alternatively, it is preferable that the conductive portion is a portion of the casing.

Preferably, the battery module further includes an insulation sheet disposed between the casing and the battery cell. Preferably, the insulation layer is formed by coating.

Another aspect of the invention provides an insulation inspecting method of a battery module comprising, providing a battery module including a casing which is made of metal and provided with an insulation layer formed on an outer surface of the casing, and a battery cell accommodated in the casing, and conducting the insulation inspection through a conductive portion provided on the outer surface of the casing.

According to the aspects of the present invention, since the conductive portion is previously formed on the casing, insulation inspection can be easily conducted in spite of simple configuration.

An embodiment of the present invention will be described with reference to the accompanying drawings. In the following description, terms indicative of specific directions and positions (e.g., terms including "up", "down", "side" and "end") are used as needed basis, but these terms are used to facilitate understanding of the invention with reference to the drawings, and these terms are not intended to limit a technical scope of the invention. Further, the following description is essentially for illustrative purposes, and the description is not intended to limit the invention, products and methods to which the invention is applied, and intended usages of the invention.

Figure 1:
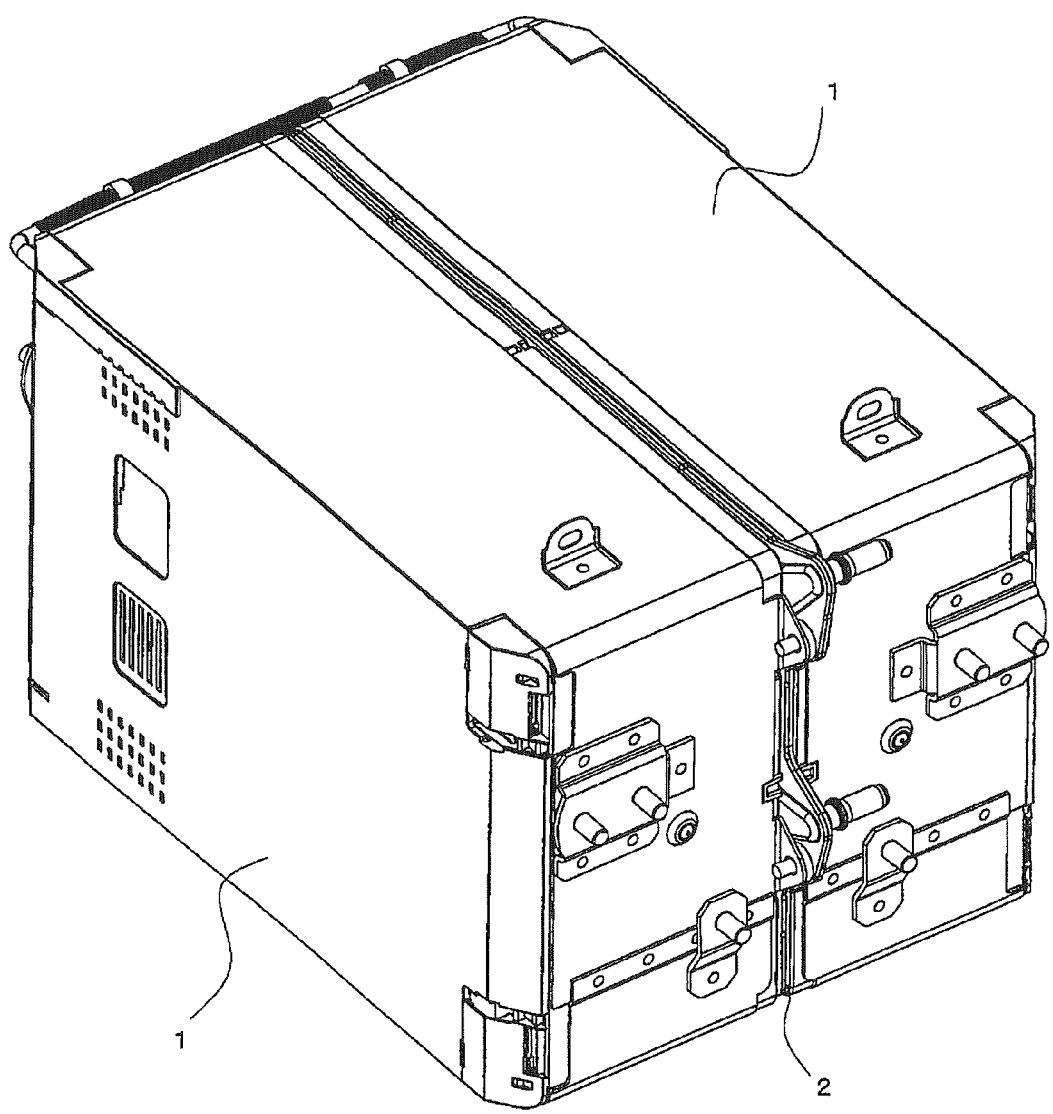
FIG. 1 is a perspective view of a battery module unit according to an embodiment.
Figure 2:
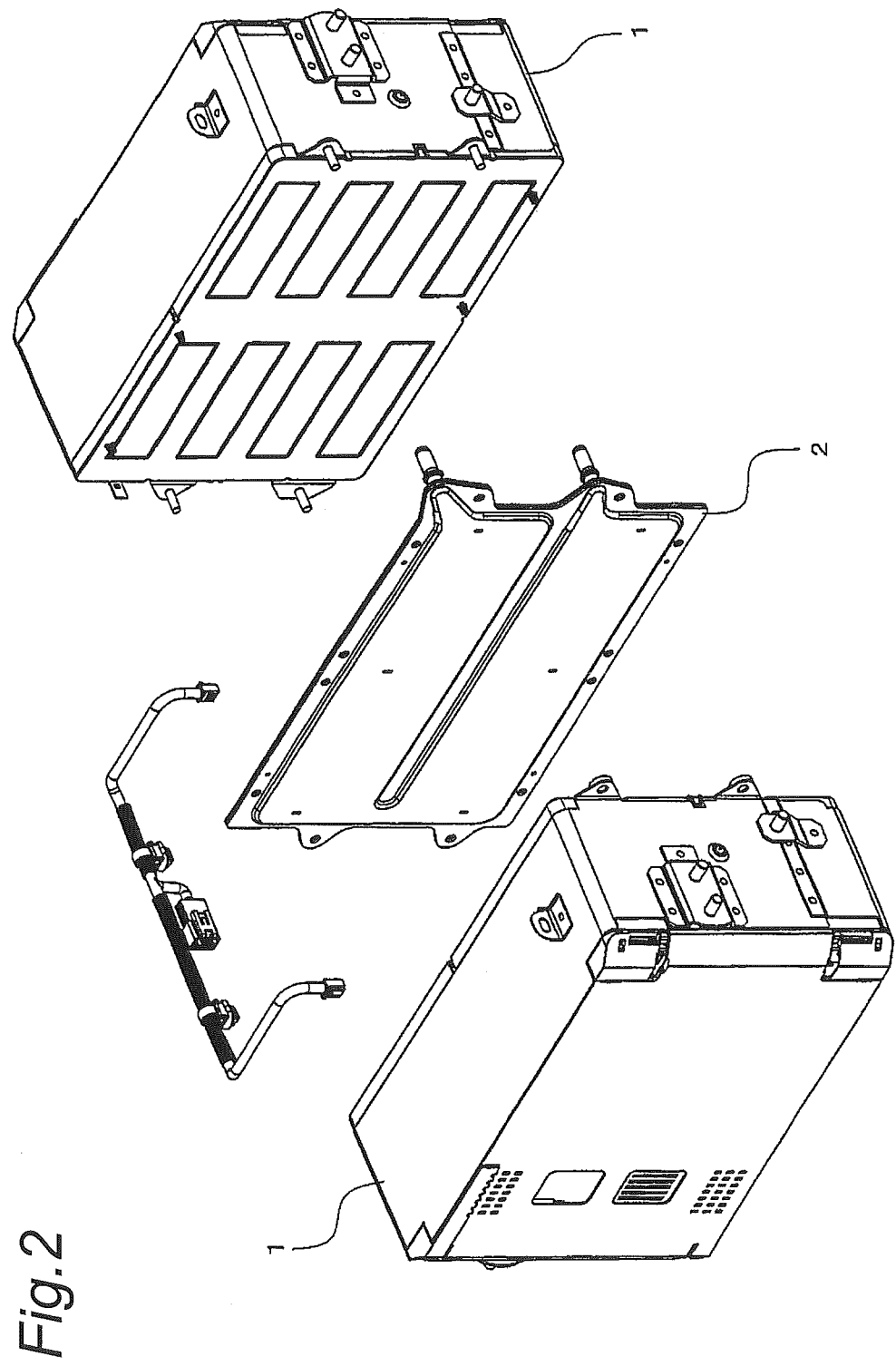
FIG. 2 is an exploded perspective view showing battery modules and a heat sink.

FIG. 1 is a perspective view of a battery module unit according to the embodiment and FIG. 2 is an exploded perspective view of the battery module unit. The battery module unit includes a pair of battery modules 1. A plate-shaped heat sink 2 is disposed between the battery modules 1.

Figure 3:
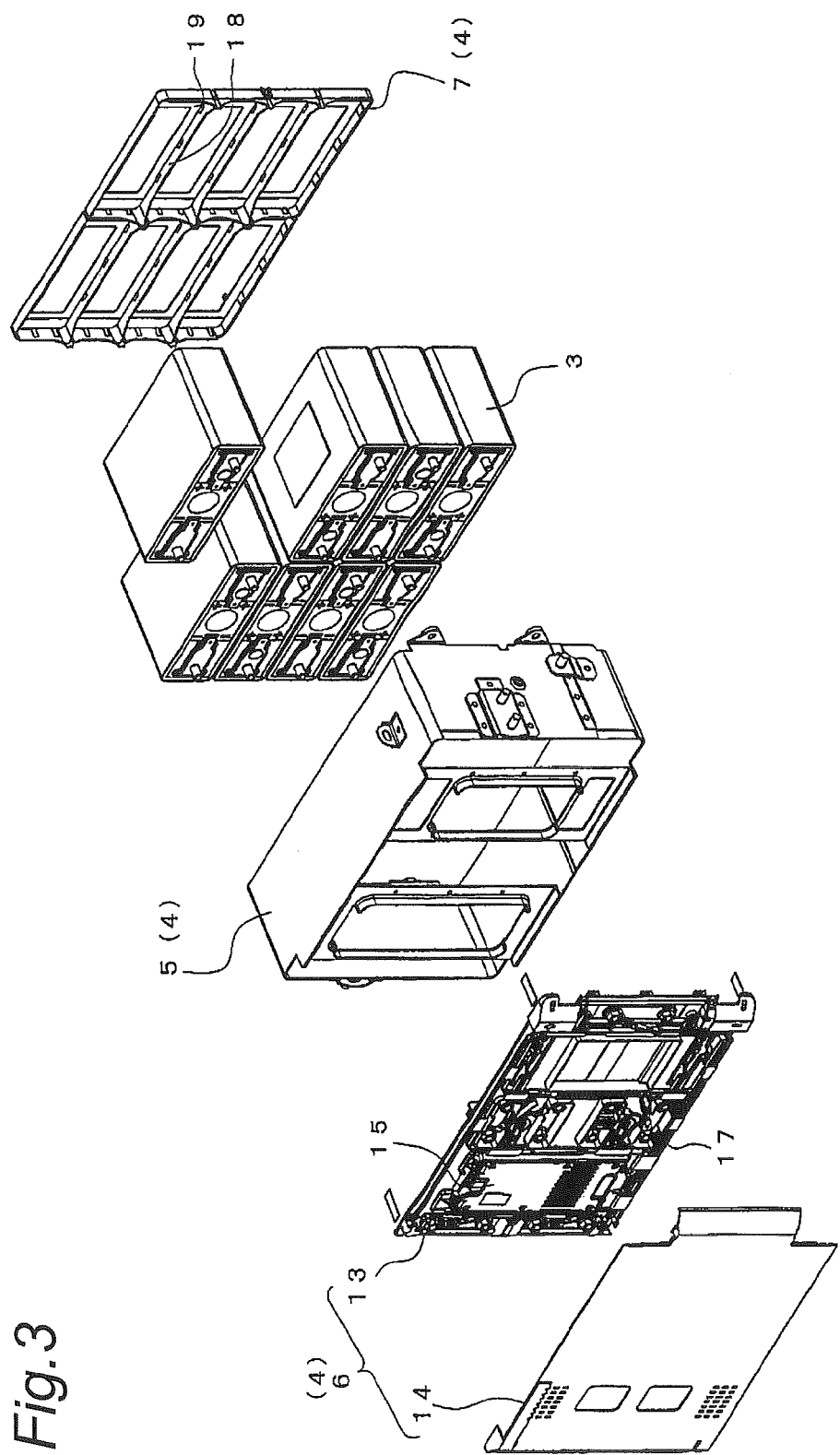
FIG. 3 is an exploded perspective view of the battery module shown in FIG. 2.

As shown in FIG. 3, each of the battery modules 1 includes two rows of four superposed battery cells 3 and these battery cells 3 are accommodated in a casing 4.

Each of the battery cells 3 is a non-aqueous electrolyte secondary battery such as a lithium ion battery. Although not illustrated in the drawings, an electricity generating element is accommodated in a battery container and the battery container is closed with a cover.

The casing 4 includes a barrel member 5 having a cylindrical configuration with a rectangular cross section. An upper surface of the barrel member 5 is covered with a cover member 6 and a lower surface of the barrel member 5 is closed with a bottom member 7.

To enhance rigidity of the entire barrel member 5, the barrel member 5 is made of metal material. To inexpensively obtain desired rigidity, iron is used as the barrel member 5. Therefore, if the barrel member 5 is used as it is, there is fear that rust is generated. Hence, insulation layers 8 are formed on an outer surface of the barrel member 5. The insulation layer 8 is made of material having excellent rust prevention properties and excellent insulation properties. The insulation layer 8 can be formed by cation electrodeposition coating for example.

Figure 4:
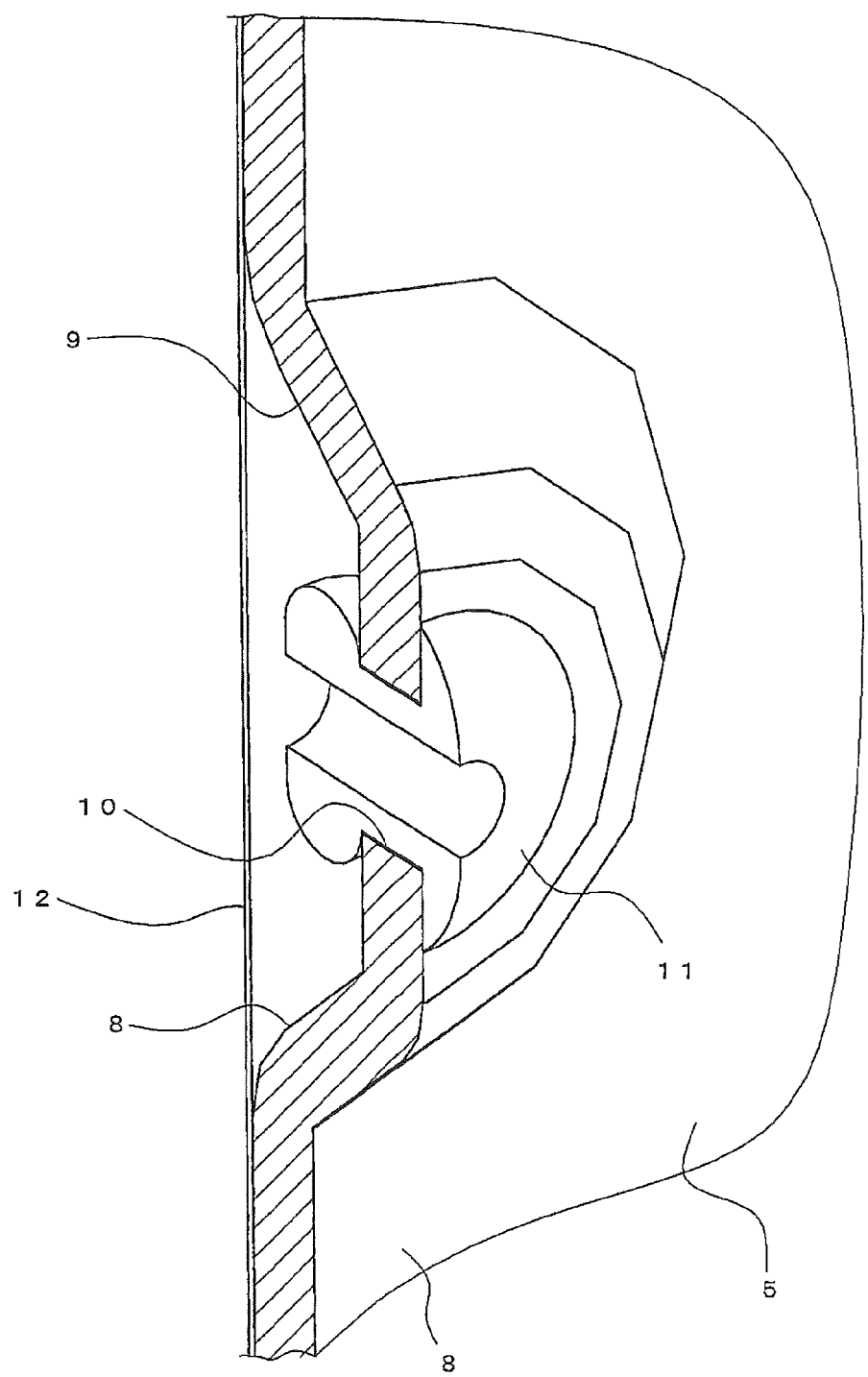
FIG. 4 is a partially sectional perspective view of a barrel member shown in FIG. 3.

As shown in FIG. 4, a recess 9 is formed in the barrel member 5 by outwardly denting a portion of an inner surface thereof. A through hole 10 is formed in a central portion of the recess 9. A masking is formed on a periphery of the through hole 10 followed by formation of the insulation layers 8, and then the masking is removed. Therefore, on an inner peripheral surface of the through hole 10, the insulation layer 8 is not formed so that the casing 4 is exposed. A rivet 11 is calked to fix to the barrel member 5 through the through hole. The rivet 11 is made of conductive material such as aluminum. According to this, a portion (inner surface of through hole 10) of the casing 4 where the insulation layer 8 is not formed can be brought into electrical conduction with outside through the rivet 11.

An insulation sheet 12 is pasted on an inner surface of the barrel member 5. As described above, the recess 9 is formed in the casing 4. Therefore, the calked portion of the rivet 11 does not project inward from the inner surface of the casing 4. That is, the inner surface of the barrel member 5 on which the insulation sheet 12 is attached maintains flat configuration. Hence, it is possible to easily attach the insulation sheet 12 on the inner surface of the casing 4. Further, the insulation sheet 12 is not scratched or damaged by the rivet 11 when the insulation sheet 12 is attached. Further, it is possible to prevent the calked portion of the rivet 11 from coming into contact with the battery cell disposed in the casing.

As shown in FIG. 3, the cover member 6 comprises an inner cover 13 and an outer cover 14. An electric component (not shown) is held by the inner cover 13. The inner cover 13 is formed from synthetic resin material and formed with a plurality of rectangular openings (not shown) respectively corresponding to the battery cells 3. A plurality of wire harnesses (not shown) are disposed on the inner cover 13. Tab terminals are respectively electrically connected to one ends of the wire harnesses 17 and the one ends of the wire harnesses 17 are respectively electrically connected to one of electrodes of the battery cells 3. The one electrodes of the adjacent battery cells 3 are electrically connected to each other through a bus bar. According to this, the battery cells 3 are electrically connected to one another in series. The outer cover 14 is formed from synthetic resin material like the inner cover 13 and closes an upper surface of the barrel member 5.

The bottom member 7 is formed from synthetic resin material, and formed with positioning recesses 19 in which the battery cells 3 can be disposed by partition walls. A bottom surface of each of the positioning recesses 19 opens except its peripheral edge. If the battery cells 3 are respectively disposed in the positioning recesses 19, the two rows of four superposed battery cells 3 are arranged. Spacers are disposed between the battery cells 3. The spacer is pasted on a central portion of one of battery cells 3 which are adjacent in a width direction. By disposing the spacer at the central portion, it is possible to effectively guide a portion of the battery cell 3 which is prone to be deformed.

Next, a producing method of the battery module having the above-described configuration will be described. The recess 9 is formed in a sidewall of the barrel member 5 outwardly from its inner surface followed by that the through hole 10 is formed in the central portion of the barrel member 5. The insulation layer 8 is formed on the surface of the barrel member 5 by the cation electrodeposition coating. The insulation layer 8 is removed from the inner peripheral surface of the formed through hole 10 and the barrel member 5 is exposed. The rivet 11 is inserted through the through hole 10 from the outer surface of the barrel member 5 and then calked in the recess 9, thereby fixing the rivet 11 to the barrel member 5. In this state, the rivet 11 is in direct contact with the barrel member 5 on the inner peripheral surface of the through hole 10, the rivet 11 passes through the insulation layer 8 and a head of the rivet 11 is exposed outside. The insulation sheet 12 is attached on the inner surface of the barrel member 5. In this case, the calked portion of the rivet 11 is located in the recess 9 of the barrel member 5 and is not exposed from the surface of the barrel member 5. Therefore, it is possible to smoothly carry out the attaching operation of the insulation sheet 12. It is possible to avoid a case where a portion of the rivet 11 comes into contact with the insulation sheet 12 so that the insulation sheet 12 is damaged.

Next, the battery cells 3 are respectively disposed in the positioning recesses 19 of the bottom member 7 followed by attachment of the barrel member 5. The inner cover 13 on which the electric component is mounted is attached to the upper surface of the barrel member 5. The one electrodes of the adjacent battery cells 3 are electrically connected to each other through the bus bar. According to this, the battery cells 3 are electrically connected to one another in series. One ends of the wire harnesses 17 are electrically connected to the one electrodes of the battery cells 3 through tab terminals. The other ends of the wire harnesses 17 are bundled together and electrically connected to the electric component. Lastly, the outer cover 14 is attached, thereby completing the battery module.

According to the battery module completed in this manner, it is possible to detect an insulation state from outside through the exposed portion (head) of the rivet 11. It is unnecessary that the exposed portion of the rivet 11 is subjected to any processing thereafter, and the exposed portion can be left as it is. Therefore, reformation the insulation layer 8 is unnecessary and the insulation detection can be conducted through the exposed portion of the rivet 11 as many times as one likes, thereby achieving economic efficiency.

The present invention is not limited to the configuration described in the embodiment and the invention can variously be modified.

Although the rivet 11 is used as the conductive portion in the embodiment, various kinds of configurations may be employed. For example, both ends of a rod member may be calked, a bolt and a nut may be used, or a metal member may be mounted on the casing 4 by welding.

Although the metal member such as the rivet 11 is mounted on the casing 4 as the conductive portion in the embodiment, it is possible to employ such a configuration that a portion of the insulation layer 8 formed on the surface of the casing 4 is peeled away to expose the casing, and the exposed portion is made as the conductive portion.

The battery module of the present invention may be employed for various batteries other than the lithium ion battery such as a lead-acid battery.

What is claimed is:

1. A battery module, comprising:
    a casing comprising a metal and provided on an outer surface of the casing with an insulation layer and a conductive portion;
    a battery cell accommodated in the casing, the battery cell generating electricity; and
    an insulation sheet disposed between an inner surface of the casing and the battery cell,
    wherein the conductive portion comprises a metal member that penetrates the casing and includes a calked portion at an inner end of the conductive portion, and
    wherein the casing includes a recess, at which an inner surface of the casing is dented outwardly, and the calked portion of the metal member is accommodated in the recess such that the calked portion does not project inward from the recess.

2. The battery module according to claim 1, wherein the conductive portion comprises a rivet which is fixed to the casing so as to penetrate the casing and the insulation layer.

3. The battery module according to claim 1, wherein the insulation layer is formed by coating.

4. An insulation inspecting method of a battery module, the method comprising:
    providing a battery module including a casing which comprises a metal and provided on an outer surface of the casing with an insulation layer and a conductive portion, a battery cell accommodated in the casing, the battery cell generating electricity, and an insulation sheet disposed between an inner surface of the casing and the battery cell,
        wherein the conductive portion comprises a metal member that penetrates the casing and includes a calked portion at an inner end of the conductive portion, and
        wherein the casing includes a recess, at which an inner surface of the casing is dented outwardly, and the calked portion of the metal member is accommodated in the recess such that the calked portion does not project inward from the recess; and
    conducting the insulation inspection through the conductive portion provided on the outer surface of the casing.

5. The battery module according to claim 1, wherein the conductive portion is provided on the outer surface of the casing.

6. The battery module according to claim 1, wherein the metal member penetrates the insulating layer.

7. The battery module according to claim 1, wherein a through hole extends in a central portion of the recess.

8. The battery module according to claim 7, wherein the casing is exposed on an inner peripheral surface of the through hole.

9. The battery module according to claim 7, wherein the insulation layer is not formed on an inner peripheral surface of the through hole.

10. The battery module according to claim 7, wherein the calked portion of the metal member is calked to the casing through the through hole.

11. The battery module according to claim 1, wherein the calked portion is located in the recess and is not exposed from a surface of the casing.

12. The battery module according to claim 11, wherein a head of the metal member is exposed from the surface of the casing.

13. The battery module according to claim 1, wherein a head of the metal member is exposed from a surface of the casing.

14. The method according to claim 4, wherein the calked portion is located in the recess and is not exposed from a surface of the casing.

15. The method according to claim 14, wherein a head of the metal member is exposed from the surface of the casing.

16. The method according to claim 15, wherein said conducting the insulation inspection comprises detecting an insulation state from outside through an exposed portion of the head of the metal member.

* * * * *